United States Patent
Dvorak et al.

(10) Patent No.: US 10,622,752 B2
(45) Date of Patent: Apr. 14, 2020

(54) ULTRASONIC WELD JOINT WITH INTEGRAL FLASH TRAP

(71) Applicant: Apple Inc., Cupertino, CA (US)

(72) Inventors: Peter A. Dvorak, Menlo Park, CA (US); Christopher J. Pawlowski, Emerald Hills, CA (US); Ross C. Heyman, Belmont, CA (US); Mathieu P. Roy, Sunnyvale, CA (US); Arun R. Varma, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/126,989

(22) Filed: Sep. 10, 2018

(65) Prior Publication Data
US 2019/0372263 A1 Dec. 5, 2019

Related U.S. Application Data (60) Provisional application No. 62/678,760, filed on May 31, 2018.

(51) Int. Cl.
*H01R 13/504* (2006.01)
*H01R 43/18* (2006.01)
(Continued)

(52) U.S. Cl.
CPC ........... *H01R 13/504* (2013.01); *B29C 65/08* (2013.01); *H01R 13/5219* (2013.01); *H01R 43/18* (2013.01)

(58) Field of Classification Search
CPC .... H01R 13/504; H01R 13/516; H01R 24/28; H01R 2103/00; H01R 13/5219;
(Continued)

(56) References Cited

U.S. PATENT DOCUMENTS 4,737,124 A 4/1988 Ezure et al.
5,079,387 A 1/1992 Weaver et al.
(Continued)

FOREIGN PATENT DOCUMENTS

AU 2018101463 10/2018
CN 104284546 A 1/2015
(Continued)

OTHER PUBLICATIONS

First Examination Report issued in Australian Application No. AU2018101463, dated Dec. 11, 2018 in 6 pages.
(Continued)

*Primary Examiner* — Gary F Paumen
(74) *Attorney, Agent, or Firm* — Kilpatrick Townsend and Stockton, LLP (57) ABSTRACT

An enclosure for an electronic device includes a housing having wall defining a cavity that is configured to receive an electronic assembly therein. The wall includes a plurality of housing steps formed in an interior surface. A cap includes a side surface extending around a perimeter of the cap with a plurality of cap steps formed in the side surface. The cap is positioned at an entrance to the cavity such that the plurality of housing steps align with the plurality of cap steps and welded in place. Flash from the weld is captured in a flash trap so that no weld flash is visible on the exterior surface of the enclosure.

18 Claims, 4 Drawing Sheets

(51) Int. Cl.
H01R 13/52 (2006.01)
B29C 65/08 (2006.01)

(58) Field of Classification Search
CPC .......... H01R 43/18; H02G 3/081; H02G 3/08;
H02G 3/14; H05K 5/0031; H05K 5/0004;
H05K 5/0052; H05K 5/02; B29C 65/08
USPC ........ 439/599, 686, 689, 695; 174/561, 560,
174/559, 520; 220/3.8, 3.7, 4.02
See application file for complete search history.

(56) References Cited

U.S. PATENT DOCUMENTS

| | | | |
|---|---|---|---|
| 5,647,751 | A | 7/1997 | Shulman et al. |
| 5,892,174 | A | 4/1999 | Hirawata |
| 6,932,640 | B1 | 8/2005 | Sung |
| 7,048,563 | B2 | 5/2006 | Fukuda et al. |
| 7,767,920 | B1 | 8/2010 | Matsuhashi et al. |
| 7,922,540 | B2 | 4/2011 | Zhang et al. |
| 8,753,132 | B2 | 6/2014 | Scritzky et al. |
| 9,343,850 | B2 | 5/2016 | Colahan et al. |
| 9,680,249 | B2 * | 6/2017 | Dvorak ................ H01R 13/504 |
| 9,882,302 | B2 * | 1/2018 | Kwan .................. H01R 13/504 |
| 10,283,898 | B2 * | 5/2019 | Heyman ............. H01R 13/504 |
| 2005/0022488 | A1 * | 2/2005 | Condrad ................ B01D 35/06 55/385.3 |
| 2005/0054239 | A1 | 3/2005 | Su |
| 2007/0293087 | A1 | 12/2007 | Kennedy et al. |
| 2009/0059636 | A1 | 3/2009 | Ho et al. |
| 2010/0150491 | A1 * | 6/2010 | Cymbal ................. F16C 33/60 384/569 |
| 2014/0308853 | A1 | 10/2014 | Colahan et al. |
| 2015/0014006 | A1 | 1/2015 | Hozumi |
| 2015/0255915 | A1 | 9/2015 | Kao et al. |

FOREIGN PATENT DOCUMENTS

| | | |
|---|---|---|
| EP | 3012640 A1 | 4/2016 |
| JP | 0687164 A | 3/1994 |
| JP | 09147716 A | 6/1997 |
| JP | 11268135 A | 10/1999 |
| JP | 2002248685 A | 9/2002 |
| JP | 2005091319 A | 4/2005 |
| KR | 20160023629 A | 3/2016 |
| TW | M544183 U | 6/2017 |

OTHER PUBLICATIONS

EP Patent Application No. 18197297.7, "Extended European Search Report", dated Mar. 29, 2019, 9 pages.
U.S. Application filed May 8, 2018, entitled Electronic Device Enclosures Having a Monolithic Appearance and assigned U.S. Appl. No. 15/974,185.
Office Action issued in Japan Application No. JP2018-183075, dated Dec. 6, 2019 in 10 pages.
Office Action issued in Taiwan Application No. TW107134479, dated Nov. 18, 2019 in 17 pages.
Gwangjatoggi, "Breakdown of Fake of Samsung Travel Charger", Naver, Available online at: https://blog.naver.com/gray1203/220403545350, dated Jun. 28. 2015 in 4 pages.
Office Action issued in Korea Application No. KR10-2018-0116594, dated Feb. 19, 2020 in 17 pages.

* cited by examiner

ULTRASONIC WELD JOINT WITH INTEGRAL FLASH TRAP

CROSS-REFERENCES TO OTHER APPLICATIONS

This application claims priority to U.S. provisional patent application Ser. No. 62/678,760, for "ULTRASONIC WELD JOINT WITH INTEGRAL FLASH TRAP" filed on May 31, 2018 which is hereby incorporated by reference in entirety for all purposes.

FIELD

The described embodiments relate generally to enclosures that are made of two or more plastic components and have an aesthetically pleasing interface where the components are joined together. More particularly, the present embodiments relate to plastic enclosures that house one or more electronics assemblies and include weld joints that are not visible from the exterior and that do not have visible exterior weld flash at the weld joints.

BACKGROUND

Currently there are a wide variety of electronic devices that have external enclosures to facilitate the use of the electronic device and provide an aesthetic appearance. However, often such enclosures have one or more seams where the plastic components of the enclosure are joined together. The external appearance of the seams can be difficult to uniformly control during high volume production and can sometimes result in a relatively weak region of the enclosure that is prone to damage and/or separation. This can be particularly problematic for enclosures that contain high-voltage electronic components that would be exposed if seam were broken and separated. New enclosures and new methods for joining enclosure components are needed so the enclosure seams are more uniform during production, are aesthetically pleasing and have improved structural integrity.

SUMMARY

Some embodiments of the present disclosure relate to enclosures for electronic devices. Various embodiments relate to plastic enclosures that are made from two or more components that are joined together with welded seams. The components can have a matched stair step geometry formed at each respective mating surface that defines a flash trap within the weld joint. The flash trap can include a reduced area adjacent to the exterior surface that creates a barrier to the flash exiting the weld joint and being visible on the exterior surface of the enclosure.

In some embodiments an enclosure for an electronic device comprises a housing including a bottom wall and at least one side wall extending from the bottom wall to define a cavity. The housing defines an opening that communicates with the cavity. The at least one sidewall has a distal end portion and a plurality of housing steps formed in an interior surface of the at least one sidewall. A cap is positioned in the opening and includes a side surface extending around a perimeter of the cap with a plurality of cap steps formed in the side surface that align with the plurality of housing steps, wherein a portion of the at least one side wall and a portion of the side surface are welded together and flash from the weld is disposed between at least one of the plurality of housing steps and at least one of the plurality of cap steps.

In some embodiments the plurality of housing steps includes a first housing step formed in the interior surface to a first depth, a second housing step formed in the interior surface to a second depth and third housing step formed in the interior surface to a third depth. In various embodiments the third depth is greater than the second depth and the second depth is greater than the first depth. In some embodiments the plurality of cap steps includes a first cap step formed in the side surface to a first distance and a second cap step formed in the side surface to a second distance. In various embodiments the second distance is less than the first distance.

In some embodiments the second housing step is aligned with the first cap step and the chamber is at least partially defined by the housing and the cap and is positioned adjacent the second housing step and the first cap step. In various embodiments a weld joint is formed between the first housing step and the first cap step.

In some embodiments a plastic enclosure comprises a first plastic component including at least one wall having an interior surface opposite an exterior surface, a distal end portion positioned at a first end of the at least one wall and a first, a second and a third housing step formed in the distal end portion of the interior surface. A second plastic component has a side surface extending around a perimeter and a first and a second cap step formed in the side surface, wherein the first and the second cap steps are aligned with the first, the second and the third housing steps. A weld joint is formed between the first housing step and the first cap step.

In some embodiments the enclosure further comprises a chamber defined between the first and the second plastic components, the chamber positioned adjacent the weld joint and containing flash from the weld joint. In various embodiments the first plastic component further includes a bottom wall and the at least one wall extends from the bottom wall to define a cavity, wherein the cavity has a receiving opening positioned opposite the bottom wall. In some embodiments the enclosure further comprises at least two electrical prongs extending from the bottom wall and configured to be inserted into an AC wall receptacle.

In some embodiments the enclosure further comprises an AC to DC converter assembly that is received within the cavity and converts AC power received from the AC wall receptacle to DC power.

In some embodiments a method of forming an electronic device having an exterior enclosure comprises forming a housing having a bottom wall and at least one side wall extending from the bottom wall to define a cavity having an opening positioned opposite the bottom wall. The at least one sidewall has a distal end portion and a plurality of housing steps formed in an interior surface of the at least one sidewall. An electronic assembly is disposed within the cavity and a cap is formed that has a side surface extending around a perimeter of the cap with a plurality of cap steps formed in the side surface. The cap is positioned in the opening such that the plurality of cap steps formed in the side surface align with the plurality of housing steps formed in the housing. A weld joint is formed between the housing and the cap and weld flash is accumulated in a chamber positioned adjacent the weld joint and defined by the housing and the cap.

In some embodiments the chamber is positioned between the weld joint and an exterior surface of the exterior enclosure. In various embodiments the plurality of housing steps includes a first housing step formed in the interior surface to a first depth, a second housing step formed in the interior surface to a second depth and third housing step formed in the interior surface to a third depth. In some embodiments the third depth is greater than the second depth and the second depth is greater than the first depth. In various embodiments the plurality of cap steps includes a first cap step formed in the side surface to a first distance and a second cap step formed in the side surface to a second distance.

In some embodiments the second distance is less than the first distance. In various embodiments the second housing step is aligned with the first cap step and the chamber is at least partially defined by the housing and the cap and is positioned adjacent the second housing step and the first cap step. In some embodiments the weld joint is formed between the first housing step and the first cap step.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Some embodiments of this disclosure are directed to electronic enclosures that have two or more plastic components joined together at a seam or joint formed between the components. While the present disclosure can be useful for a wide variety of configurations, some embodiments of the disclosure are particularly useful for electronic enclosures that have an aesthetically appealing exterior surface and/or that enclose high voltage electronic assemblies that would be dangerous to a user if the enclosure separated, as described in more detail below.

For example, in some embodiments joining of the two or more plastic components housing and the cap can be performed with a process known in the art as ultrasonic welding. In various embodiments the joint is formed using an ultrasonically welded configuration that includes a matched stair step geometry formed in both the housing and the cap. The matched stair step geometry defines a flash trap within the weld joint that has a large area immediately adjacent the weld initiation zone and a reduced area on an opposite side of the flash trap. The reduced area creates a barrier to movement of the welding residue, also referred to as flash herein, restraining the flash from exiting the weld joint and becoming visible on an exterior surface of the enclosure.

More specifically, as the weld joint melts and generates flash, the flash is contained within the flash trap and is restricted from exiting the weld joint and becoming visible at an exterior surface of the electronic enclosure. As a result, flash can be contained within the weld joint within the integral flash trap so the welding process can be more consistently controlled during high volume manufacturing resulting in a more consistent aesthetically appealing appearance. These features and others will be described in more detail herein.

In order to better appreciate the features and aspects of plastic enclosures joined together with a matched stair step joint having an integral flash trap according to the present disclosure, further context for the disclosure is provided in the following section by discussing one particular implementation of an electronic enclosure according to embodiments of the present disclosure. These embodiments are for example only and other embodiments can be employed in other electronic devices such as, but not limited to wireless routers, wireless television devices, computers, watches, media players and other devices.

Figure 1:
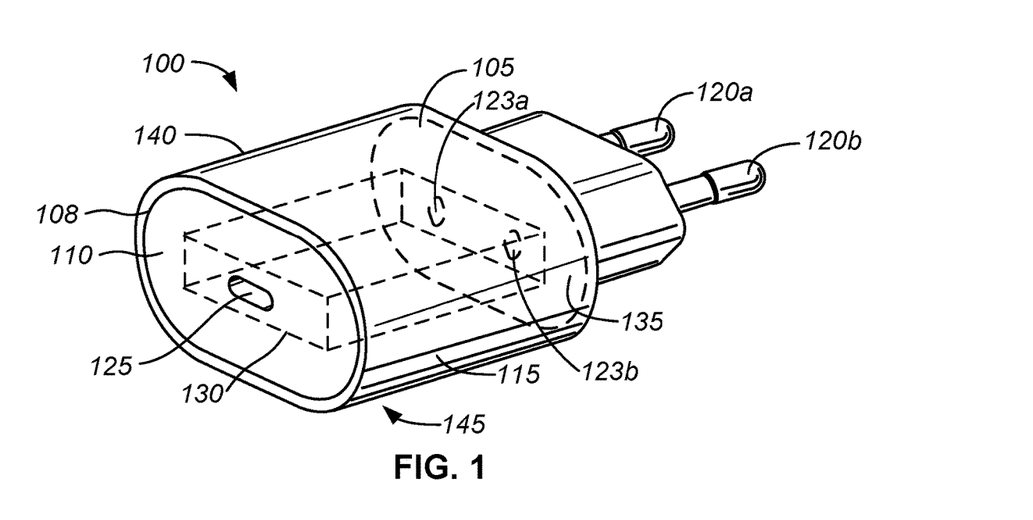
FIG. 1 is a front perspective view of an electronic device having an enclosure, according to some embodiments of the disclosure.

FIG. 1 illustrates a simplified perspective view of an electronic device 100 having an enclosure 105 joined together with a matched stair step weld joint 108 having an integral flash trap, as described in more detail below. As shown in FIG. 1, in some embodiments electronic device 100 can be a plug-in AC to DC adapter that has an enclosure 105 including a cap 110 welded to a housing 115.

Housing 115 can include a bottom wall 135 and at least one side wall 140 extending from the bottom wall to a distal end portion 145 that is coupled to cap 110. Two electrical prongs 120a, 120b extend out of housing 115 and are configured to be plugged into an AC wall outlet. Although two electrical prongs 120a, 120b illustrated in FIG. 1 are compatible with selected European receptacles, in other embodiments a different configuration of and/or number of prongs can be used that are compatible with other standards such as, but not limited to, United States, Japan and China. Two electrical prongs 120a, 120b can be electrically coupled to contacts 123a, 123b that correspond, respectively, to the two electrical prongs and provide electrical continuity therebetween. Cap 110 can include a receiving opening 125 that is configured to receive a mating connector.

In some embodiments, enclosure 105 encases an AC to DC electronics assembly 130 that can receive electrical power (e.g., 120 Volts AC) through contacts 123a, 123b and two electrical prongs 120a, 120b when the two electrical prongs are engaged with a wall receptacle. Electronics assembly 130 can be configured to transform the AC power received from the receptacle connector to DC power (e.g., 5 Volts DC) that can be supplied to an electronic computing device through a mating connector inserted in receiving opening 125, as described in more detail below.

Figure 2:
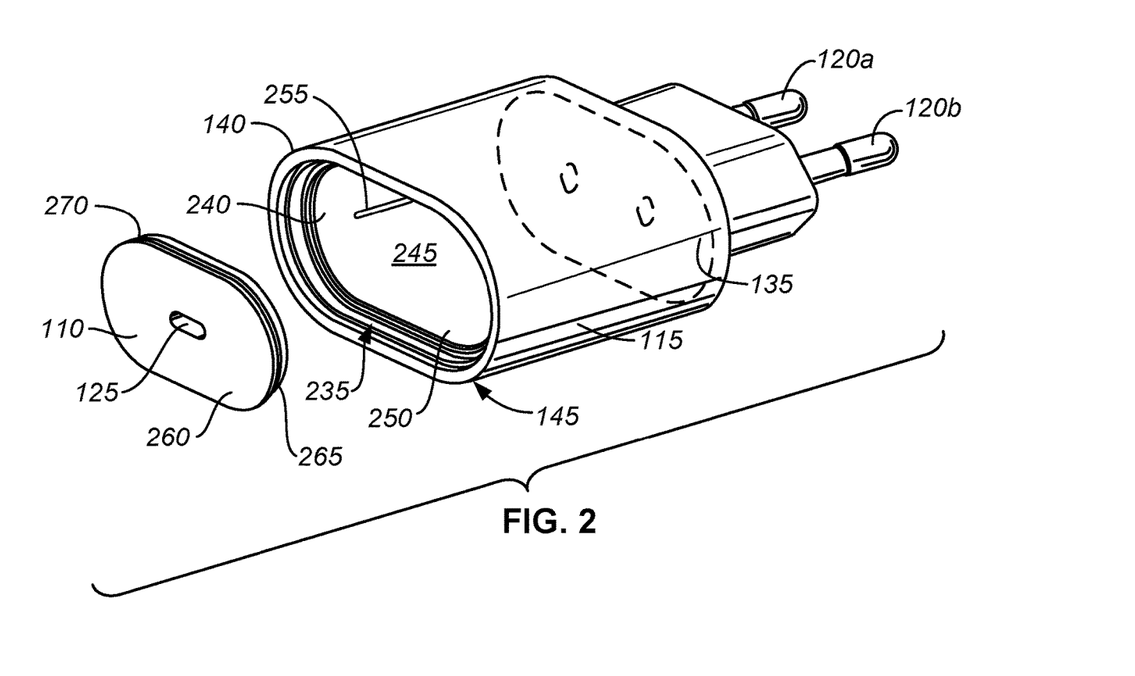
FIG. 2 is a partial exploded view of the enclosure shown in FIG. 1.

FIG. 2 illustrates a partial perspective view of cap 110 removed from housing 115. In some embodiments, housing 115 includes a bottom wall 135 and at least one sidewall 140 extending from the bottom wall. The at least one side wall has a distal end portion 145 with plurality of successive housing steps 235 formed on interior surface 240 resulting in a stair step geometry, as described in more detail below. The bottom wall and at least one sidewall can form a cavity 245 having an opening 250 sized to receive electronic assembly 130. One or more alignment features 255 can be positioned on interior surface 240 of one or more sidewalls 140 to align the electronic assembly within cavity 245 of the housing.

FIG. 2 also illustrates that cap 110 can include a top wall 260 and a plurality of successive cap steps 265 formed along a perimeter side surface 270, resulting in a stair step geometry. In some embodiments plurality of successive housing steps 235 are configured to align with the one or more successive cap steps 265 to form a weld joint having a matched stair step joint and an integral flash trap formed between housing 115 and cap 115, as described in more detail below. Opening 125 in cap 115 is configured to align with a connector disposed within electronic assembly 130 (see FIG. 1). Although the embodiment illustrated in FIGS. 1 and 2 is shown as a cap and housing, the stair step joint with integral flash trap can be applied to any type of plastic housing including a clamshell, three-piece or other type of enclosure.

Figure 3:
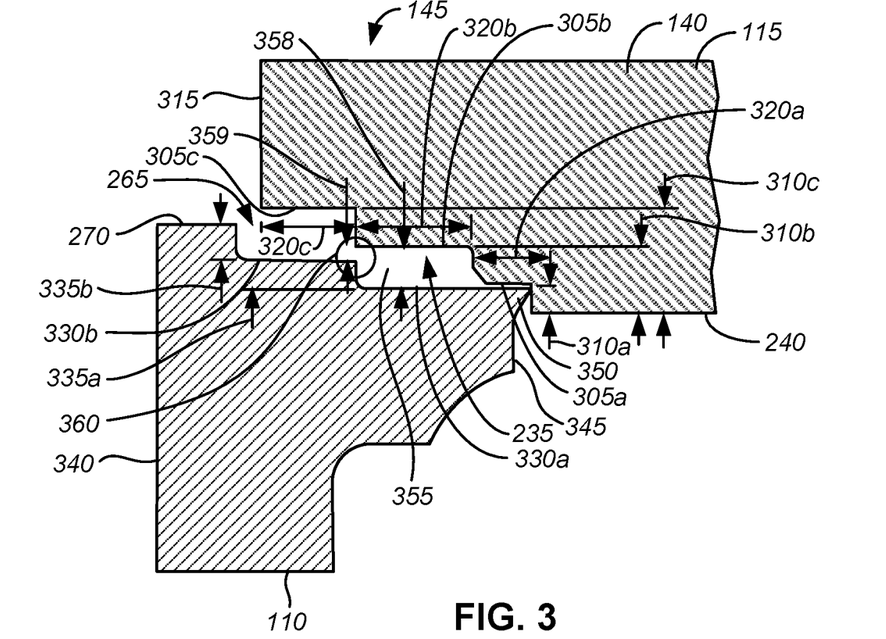
FIG. 3 is a partial cross-sectional view of an interface between the housing and the cap of the enclosure shown in FIGS. 1 and 2, before a welding process.
Figure 4:
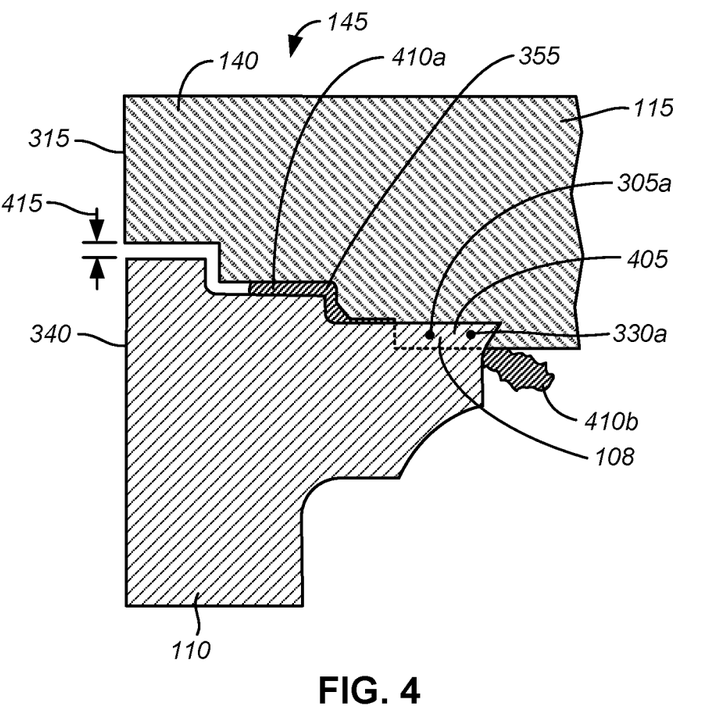
FIG. 4 is a partial cross-sectional view of the interface shown in FIG. 3 after the welding process.

FIGS. 3 and 4 illustrate cross-sections of portions of housing 115 and cap 110 before and after weld joint 108, respectively. More specifically, FIG. 3 shows a cross-section of distal end 145 of at least one sidewall 140 of housing 115 having plurality of successive housing steps 235 formed therein. Plurality of successive housing steps 235 can also be described as a series of offset openings of descending sizes. Plurality of successive housing steps 235 includes a first housing step 305a formed in interior surface 240 to a first depth 310a from interior surface 240 and positioned around an interior perimeter of at least one side wall 140. A second housing step 305b is also formed in interior surface 240 and is formed in interior surface 240 to a second depth 310b from interior surface 240, where the second depth is greater than the first depth. A third housing step 305c is also formed in interior surface 240 and is formed in interior surface 240 a third depth 310c from interior surface 240, where the third depth is greater than the second depth.

First housing step 305a has a first width 320a, second housing step 305b is positioned adjacent first housing step and has a second width 320b, and third housing step 305c is positioned adjacent second housing step 305b and has a third width 320c. Third housing step 305c is positioned adjacent exterior surface 315 and third width 320c is measured from an exterior surface of at least one sidewall 140 to second housing step 305b. In some embodiments a width of a step may also be called a "run" as colloquially known.

Similarly, FIG. 3 also shows a cross-section of a portion of cap 110. Cap 110 includes plurality of successive cap steps 265 formed along perimeter side surface 270. Plurality of successive cap steps 265 includes a first cap step 330a formed in side surface 270 to a first depth 335a relative to perimeter side surface 270. A second cap step 330b is also formed in perimeter side surface 270 and is formed to a second depth 335b from the perimeter side surface, where the second depth is less than the first depth. Second cap step 330b is positioned near outer surface 340 of cap 110 and first housing step 305a is positioned adjacent second cap step 330b and an inner surface 345 of cap 110.

As shown in FIG. 3 housing 115 and cap 110 include matched stair step geometries such that plurality of successive cap steps 265 are aligned with plurality of successive housing steps 235, as described in more detail below. Cap 110 can have a weld initiation zone 350 that aligns with and is positioned in contact with a portion of first housing step 305a. Further, second housing step 305b can align with first cap step 330a in cap 110 to define a flash trap 355, or "chamber". Flash trap 355 can be configured to be positioned adjacent weld initiation zone 350 so weld flash that is generated within weld joint 108 (see FIGS. 1 and 3) is contained in the flash trap.

Flash trap 355 can reduce in volume (e.g., neck down) in a restriction region 360 such that flash can be expelled into flash trap 355 with little restriction, but the flash is restrained from moving past restriction region 360 by the reduced area. Therefore, flash trap 355 can contain the flash and restrain it from moving to exterior surface 315 where it is visible. In some embodiments a width 358 of flash trap 355 can be between 0.4 and 0.5 millimeters and a width 359 of restriction region 360 can be approximately 0.15 millimeters, resulting in a ratio of between 2.6 to 3.3.

In this particular embodiment flash trap 355 is defined by second housing step 305b in 115 and first cap step 330a in cap 110, however in various embodiments other geometries and features can be used to define the flash trap.

During the movement of cap 110, flash 410a can cool resulting in an increase in viscosity such that the flash does not reach exterior surface 315. More specifically, during the initial portion of the welding process, the generated flash can be relatively hot and may have a low viscosity such that without the integral flash trap the flash can rapidly travel through the interface between housing 115 and cap 110 with a relatively high velocity such that flash trap 355 is needed to keep it from reaching exterior surface 315. However, during a latter portion of the weld process, the flash can be cooled by adjacent material thereby increasing its viscosity and reducing its velocity such that it does not exit flash trap 355 as the flash trap volume is reduced.

Further, the size restriction region 360 and of a gap 415 between housing 115 and cap 110 can be selected to be sufficiently narrow to arrest the movement of flash 410a such that the flash does not reach exterior surface 315. In some embodiments gap 415 can be between 0.10 and 0.25 millimeters. Weld joint 108 can also result in interior flash formation 410b that is not visible from the exterior. During welding air can escape from weld joint 108 through gap 415. In various embodiments, at the end of the welding process exterior surface 315 can be substantially coplanar with outer surface 340.

In some embodiments weld 108 can be formed with an ultrasonic welding process. In various embodiments the ultrasonic welding process involves applying high frequency (e.g., in the range of 10 kHz to 40 kHz) acoustic vibrations to work pieces (e.g., housing 115 and/or cap 110) held together under pressure to create a solid-state weld. In further embodiments a force can be applied to the work pieces (e.g., housing 115 and/or cap 110) to push them together during the welding process.

The vibrations cause heat to be generated at the interfaces where cap 110 and housing 115 are in contact with each other as a result of the friction between the surfaces. The heat causes localized regions of cap 110 and housing 115 to melt and form weld joint 108. At the weld joint flash is generated that is extruded out of the weld. In this embodiment it can be seen that the weld joint is contained entirely within enclosure 105 so that no weld flash or weld deformation can be seen from the exterior. The only joint observable from the exterior is gap 415 between housing 115 and cap 110 that is not welded, therefore gap 415 can be consistently controlled during production resulting in a consistent aesthetically pleasing appearance for the enclosure.

Figure 5:
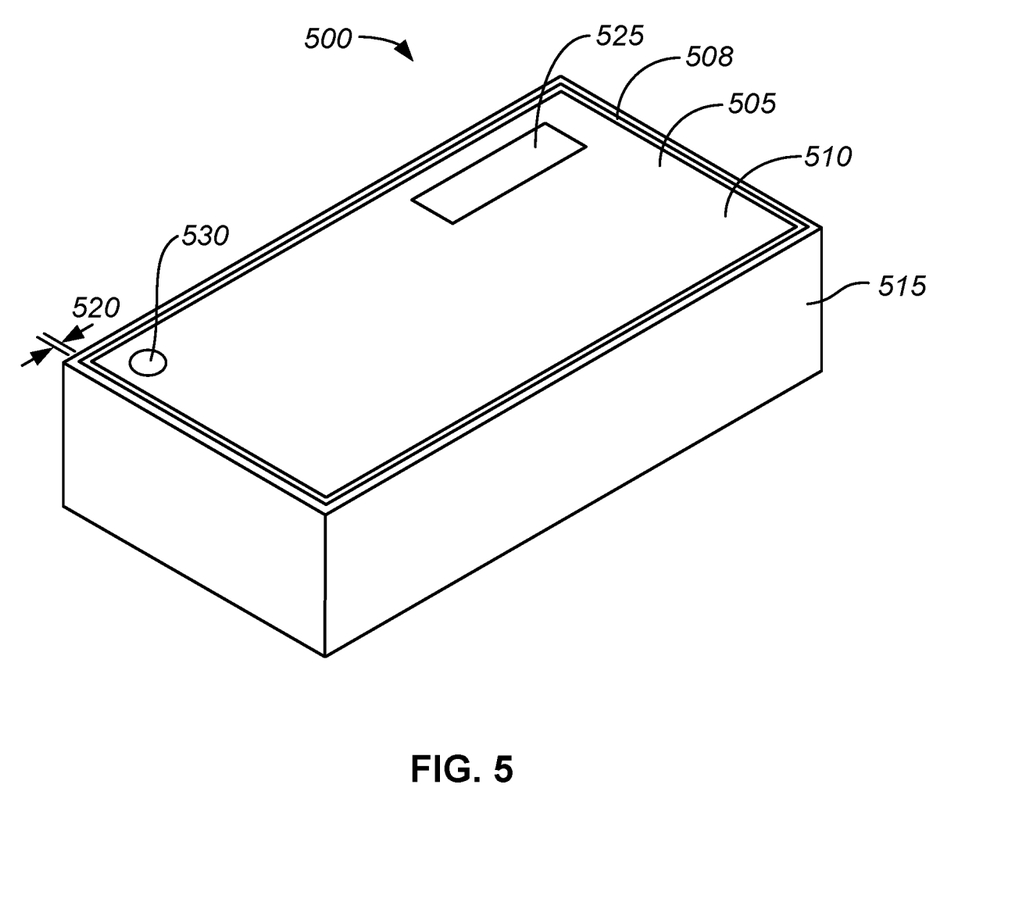
FIG. 5 is top perspective view of an electronic device having an enclosure, according to some embodiments of the disclosure.

Weld joints having a matched stair step geometry with an integral flash trap, such as weld 108 in FIGS. 1-4, can be used to join myriad other plastic components together when it is desired to have weld joint that is free from externally visible flash. For example, FIG. 5 illustrates a simplified perspective view of an electronic device 500, that can be used, for example, as an underwater diving device according to some embodiments of the disclosure. In some embodiments electronic device 500 can have an enclosure 505 that is made from a cap 510 joined to a housing 515 with a weld joint 508 similar to that illustrated in FIGS. 1-4. Weld joint 508 can be formed within enclosure 505 with a single shear joint having an integral flash trap as described in detail above in FIGS. 2 and 3. The single shear joint can result in a joint that has no visible exterior flash. In some embodiments the joint can include a gap 520 between housing 515 and cap 510 that is visible from the exterior.

In the embodiment shown in FIG. 5, enclosure 505 is illustrated as including a display 525 (e.g., a touch display) and an input button 530 however other embodiments can have different user interface features. Since enclosure 505 can, in some embodiments, completely encompass the electronics assembly the electronic assembly within the enclosure can use inductive charging with a separate inductive charging station such that no penetrations are needed through enclosure 505, making enclosure 505 completely sealed such that it is liquid-tight. In some embodiments enclosure 505 can have a battery or other power source within it. Embodiments of the disclosure are not limited to any particular electronic device. In some embodiments enclosure 505 can be used for electronic devices that have different components and/or features than those shown in FIG. 5.

For example, in some embodiments enclosure 505 can be used to enclose electronics assemblies such as, but not limited to, a smartphone, a tablet computer, a laptop or other type of computer, a watch, a wireless communication transceiver, a wireless router, an RFID device, a wirelessly activated tag for locating lost keys or an AC to DC adapter, as explained in more detail below. In one example, enclosure 505 can be used to encase a wireless transceiver, a rechargeable battery and a wireless charging interface to charge an internal battery. The enclosure can be formed without penetrations through the enclosure so the internal electronic assembly is fully encased and protected from water, moisture, dust or other environmental contaminants.

In further embodiments, enclosure 505 can be used for purposes other than enclosing an electronic device. In one example, enclosure 505 can be used to form an aesthetically appealing enclosure for an antique (e.g., a coin or a piece of ancient artwork) that needs to be protected from damage and/or exposure to the environment. As would be recognized by one of skill in the art, a weld joint formed between two plastic components that has a matched stair step geometry with an integral flash trap and no visible flash on the exterior surface is useful for myriad of enclosures.

As defined herein, liquid-tight shall mean a seal that conforms to one or more of the following ratings as defined by the International Protection Rating and International Electrotechnical Commission (IEC) 60529 that can also be known as the I.P. 68 rating. In some embodiments the liquid-tight seal will protect the electronic assembly against the harmful ingress of water and have a "liquid ingress" rating between 1 (dripping water) and 8 (immersion beyond 1 meter). In various embodiments the liquid-tight seal shall be rated between 1 (dripping water) and 4 (splashing water) while in some embodiments the liquid-tight seal shall be rated between 2 (dripping water with device tilted at 15 degrees) and 5 (water jet). In various embodiments the liquid-tight seal shall be rated between 3 (spraying water) and 6 (powerful water jets) while in some embodiments the liquid-tight seal shall be rated between 4 (splashing water) and 7 (immersion up to 1 meter). In various embodiments the liquid-tight seal shall be rated between 5 (water jets) and 8 (immersion beyond 1 meter) while in some embodiments liquid-tight shall mean the seal will protect the electronic device against liquid ingress up to 100 feet for 30 minutes.

Figure 6:
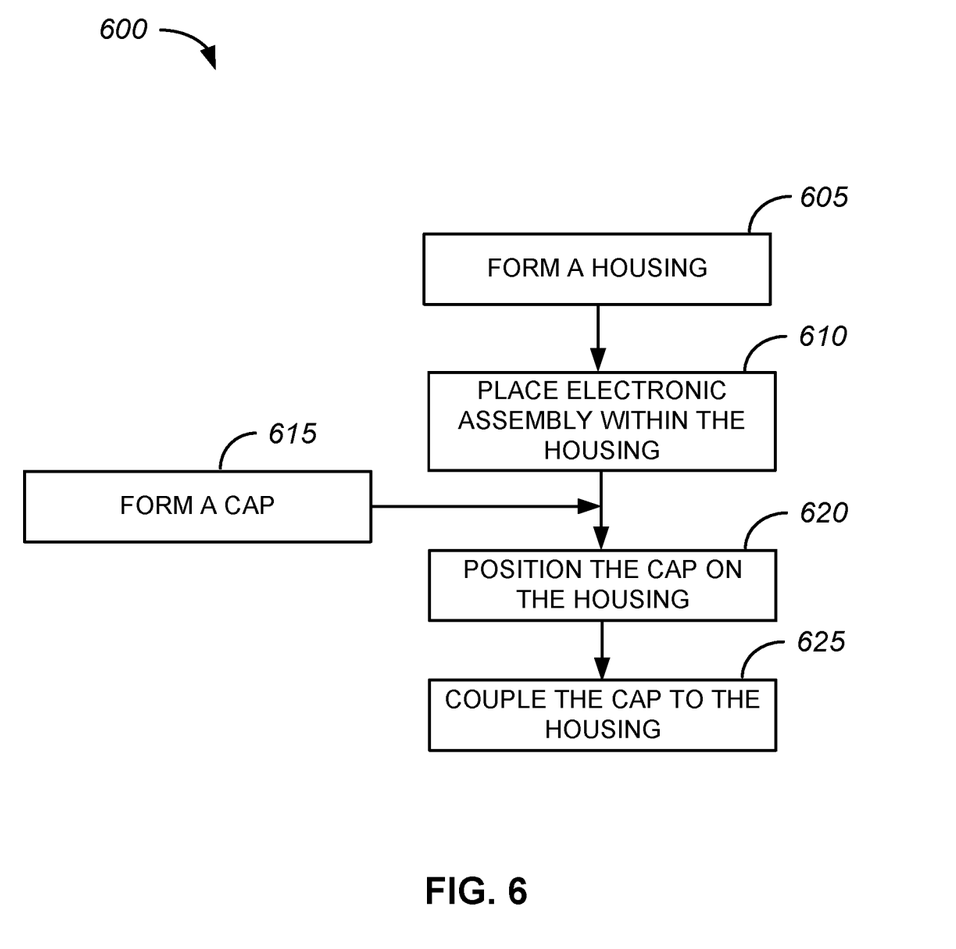
FIG. 6 is a flowchart depicting a process for forming an enclosure according to some embodiments of the disclosure.

FIG. 6 illustrates a method 600 for making an enclosure such as enclosure 105 in FIGS. 1-4 or 505 in FIG. 5. In step 605 a housing is formed. In one embodiment the housing can have a rear wall and one or more sidewalls that extend from the rear wall to form a cavity. In step 610, an electronic assembly is placed within the cavity. In step 615 a cap is formed. The cap can be formed prior to, simultaneously with or after the housing is formed in step 605. In one embodiment the cap is relatively flat with one or more penetrations formed through it. In step 620 the cap is positioned on the housing such that a plurality of steps formed in the cap are aligned with a plurality of housing steps formed in the housing. In step 625 ultrasonic welding is performed between the cap and the housing, joining them together as one enclosure. The weld joint includes an integral flash trap that prevents weld flash from forming on an exterior surface of the enclosure as described above.

In some embodiments the two plastic components can both be housings with walls. More specifically, in one embodiment two housings, such as housing 105 in FIG. 2 can be joined together with the same weld interface as illustrated in FIGS. 3 and 4. The second component, used in place of cap 110, can have a wall similar to wall 115 of housing 105, however the wall can have plurality of cap steps 265 formed in an outside surface such that a geometry that is similar to outside edge of cap 110 is formed.

Although electronic device 100 (see FIG. 1) is described and illustrated as one particular type of electronic device, embodiments of the disclosure are suitable for use with a myriad electronic devices. For example, any device that receives or transmits audio, video or data signals can be used with embodiments of the disclosure. In some instances, embodiments of the disclosure are particularly well suited for use with portable electronic media devices because of their potentially small form factor and need for aesthetically appealing enclosures.

As used herein, an electronic media device includes any device with at least one electronic component that can be used to present human-perceivable media. Such devices can include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, as well as tablet (e.g., Apple's iPad devices), laptop or other mobile computers. Some of these devices can be configured to provide audio, video or other data or sensory output.

For simplicity, various internal components, such as the AC/DC converter circuitry, power transfer circuitry, internal connectors and other components of electronic devices 100 and 500 (see FIGS. 1 and 5) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An enclosure for an electronic device comprising:
   a housing including a bottom wall and at least one side wall extending from the bottom wall to define a cavity, the housing defining an opening that communicates with the cavity, the at least one side wall having a distal end portion and a first, a second and a third housing step formed in an interior surface of the at least one side wall;
   a cap positioned in the opening and including a side surface extending around a perimeter of the cap with a first and a second cap step formed in the side surface that align with the first, the second and the third housing steps, wherein the first cap step is adjacent the cavity and is welded to the housing; and
   a continuous chamber defined between the second housing step and the second cap step and between the third housing step and the third cap step, wherein the chamber defines an opening that communicates with an exterior surface of the enclosure, and wherein flash from the weld is disposed in the chamber.

2. The enclosure of claim 1 wherein the first housing step is formed in the interior surface to a first depth, the second housing step is formed in the interior surface to a second depth and the third housing step is formed in the interior surface to a third depth.

3. The enclosure of claim 2 wherein the third depth is greater than the second depth and the second depth is greater than the first depth.

4. The enclosure of claim 2 wherein the first cap step is formed in the side surface to a first distance and the second cap step is formed in the side surface to a second distance.

5. The enclosure of claim 4 wherein the second distance is less than the first distance.

6. The enclosure of claim 4 wherein the second housing step is aligned with the first cap step and the chamber is at least partially defined by the housing and the cap and is positioned adjacent the second housing step and the first cap step.

7. A plastic enclosure comprising:
   a first plastic component including:
      at least one wall having an interior surface opposite an exterior surface;
      a cavity at least partially defined by the interior surface;
      a distal end portion positioned at a first end of the at least one wall;
      a first, a second and a third housing step formed in the distal end portion of the interior surface;
   a second plastic component having a side surface extending around a perimeter and a first and a second cap step formed in the side surface, wherein the first and the second cap steps are aligned with the first, the second and the third housing steps;
   a weld joint positioned adjacent the cavity and formed between the first housing step and the first cap step; and
   a continuous chamber defined between the second housing step and the second cap step and between the third housing step and the third cap step, wherein the chamber defines an opening that communicates with an exterior surface of the enclosure, and wherein the chamber contains flash from the weld joint.

8. The enclosure of claim 7 wherein the first plastic component further includes a bottom wall and the at least one wall extends from the bottom wall to define a cavity, wherein the cavity has a receiving opening positioned opposite the bottom wall.

9. The enclosure of claim 8 wherein the enclosure further comprises at least two electrical prongs extending from the bottom wall and configured to be inserted into an AC wall receptacle.

10. The enclosure of claim 9 further comprising an AC to DC converter assembly that is received within the cavity and converts AC power received from the AC wall receptacle to DC power.

11. A method of forming an electronic device having an exterior enclosure, the method comprising:
    forming a housing having a bottom wall and at least one side wall extending from the bottom wall to define a cavity having an opening positioned opposite the bottom wall, the at least one side wall having a distal end portion and a plurality of housing steps formed in an interior surface of the at least one side wall;
    disposing an electronic assembly within the cavity;
    forming a cap having a side surface extending around a perimeter of the cap with a plurality of cap steps formed in the side surface;
    positioning the cap in the opening such that the plurality of cap steps formed in the side surface align with the plurality of housing steps formed in the housing; and
    forming a weld joint between the housing and the cap and accumulating weld flash in a continuous chamber positioned adjacent the weld joint and defined between a second housing step and a second cap step and between a third housing step and a third cap step, wherein the chamber defines an opening that communicates with an exterior surface of the enclosure.

12. The method of claim 11 wherein the chamber is positioned between the weld joint and an exterior surface of the exterior enclosure.

13. The method of claim 11 wherein the plurality of housing steps includes a first housing step formed in the interior surface to a first depth, a second housing step formed in the interior surface to a second depth and third housing step formed in the interior surface to a third depth.

14. The method of claim 13 wherein the third depth is greater than the second depth and the second depth is greater than the first depth.

15. The method of claim 13 wherein the plurality of cap steps includes a first cap step formed in the side surface to a first distance and the second cap step is formed in the side surface to a second distance.

16. The method of claim 15 wherein the second distance is less than the first distance.

17. The method of claim 15 wherein the second housing step is aligned with the first cap step and the chamber is at least partially defined by the housing and the cap and is positioned adjacent the second housing step and the first cap step.

18. The method of claim 15 wherein the weld joint is formed between the first cap step and the housing.

* * * * *